United States Patent [19]

Saddow et al.

[11] Patent Number: 4,891,730
[45] Date of Patent: Jan. 2, 1990

[54] MONOLITHIC MICROWAVE INTEGRATED CIRCUIT TERMINAL PROTECTION DEVICE

[75] Inventors: Stephen E. Saddow, Howard County; Robert V. Garver, Boyds; Roger Kaul, Olney, all of Md.

[73] Assignee: The United States of America as represented by the Secretary of the Army, Washington, D.C.

[21] Appl. No.: 351,114

[22] Filed: May 10, 1989

[51] Int. Cl.⁴ .............................................. H02H 9/06
[52] U.S. Cl. ...................................... 361/111; 361/56; 361/120; 361/129; 313/595; 313/603; 313/308
[58] Field of Search .................... 361/56, 91, 111, 112, 361/117, 120, 129; 337/20, 29, 34; 313/595, 603, 308, 309

[56] References Cited

U.S. PATENT DOCUMENTS

| | | | |
|---|---|---|---|
| 2,777,974 | 6/1955 | Brattain et al. | 317/234 |
| 2,793,331 | 5/1957 | Lamb | 317/235 |
| 3,748,522 | 7/1973 | Geppert | 313/308 X |
| 4,054,813 | 10/1977 | Agnoux et al. | 313/198 |
| 4,096,541 | 6/1978 | Bohin et al. | 313/308 X |
| 4,277,812 | 7/1981 | Jones | 361/119 |
| 4,438,365 | 3/1984 | Atkinson | 361/111 X |

OTHER PUBLICATIONS

Sze, *Physics of Semiconductor Devices*, 2nd ed., 1981, John Wiley & Sons, Chapter 12, 681–724.

Primary Examiner—Todd E. DeBoer
Attorney, Agent, or Firm—Saul Elbaum; Guy M. Miller

[57] ABSTRACT

A monolithic microwave integrated circuit is enclosed within an ionizable gas filled housing having a terminal protection device integral with the circuit's substrate. A photon generating region extends within the substrate and along a portion of the surface area of the substrate for facilitating the ionizing of the gas. First and second electrodes, in contact with the substrate surface area and disposed on opposite sides of the photon generating region, have a plurality of cantilevered protrusions extending over the surface of the substrate and equally spaced from one another forming spark-gaps therebetween. One electrode is connected to an input to the device while the other is connected to ground. When a potential difference between the first and second electrodes increases towards a predetermined value, due to high RF input energy, the photon generating region is operatively biased to emit photons, which ionize the gas, resulting in a voltage discharge across the spark-gaps to occur quickly and at a lower voltage than the semiconductor breakdown voltage.

6 Claims, 1 Drawing Sheet

MONOLITHIC MICROWAVE INTEGRATED CIRCUIT TERMINAL PROTECTION DEVICE

RIGHTS OF THE GOVERNMENT

The invention described herein may be manufactured, used and licensed by or for the United States Government for Governmental purposes without payment to us of any royalty thereon.

BACKGROUND OF THE INVENTION

1. Field of the Invention

The present invention relates to protection techniques for semiconductor devices and, more particularly, is directed towards a novel terminal protection device for monolithic mircowave integrated circuits that prevents damage to monolithic microwave integrated circuits upon the introduction of extreme RF energy.

2. Description of the Prior Art

The trend in advanced electronic systems is toward increasing integration, reliability, radiation hardness, and lower cost in large volume production. For example, monolithic microwave integrated circuits (MMICs) have been developed to replace standard microwave integrated circuits with the benefits of reduction in size and cost while also improving reliability. Unfortunately, these MMICs are inherently susceptible to damage from extraneous RF energy. High levels of energy injected into the MMIC at the input terminal can cause circuit elements on the semiconductor substrate to be damaged. Consequently, some sort of terminal protection device (TPD) and technique is required to eliminate this problem. These TPDs must not only eliminate the possibility of RF damage, but must also be consistent with the MMIC goals of low cost, small size, high level of integration and high reliability.

While it is well known how to protect semiconductor devices from over voltage conditions, these prior art devices and techniques are not suitable in MMICs. Traditional TPDs are discrete devices which are inserted into the RF transmission path at some convenient point such as between the antenna and radar transciever. However, MMICs will be connected, in many cases, to the antenna directly without intervening RF transmission paths suitable for traditional TPD insertion. Other standard solid state protection techniques such as PIN limiters are unable to handle the extreme powers and, in addition, require additional solid state processing steps which increases MMIC costs. Other techniques such as that disclosed in U.S. Patent 2,793,331 to Lamb are inconvenient, are incompatible with the high level of integration of MMICs and are slow in triggering. Gas discharge devices are slow in responding to over voltages in that the formation of the discharge plasma which carries the current must be initiated by a free electron. The electron needed to initiate the discharge is termed a "seed electron." An electron may be freed from one of the surfaces by field emission, but extremely high voltages are required. An electron may be created by an occasional cosmic ray, but this happens too infrequently to provide a small turn on delay, although this is the normal mode of providing seed electrons. The most popular method of providing seed elelctrons for T-R tubes, for example, is to place a radioactive source close to the volume in which the arc is to be formed. The radioactive source provides a constant supply of seed electrons and the only delay is the formation time of the arc. A radioactive source may, however, degrade the performance of the semiconductor junctions in the MMIC package.

Consequently, it is desirable to have a TPD in which the TPD is integral to the MMIC and fast acting. It is also desirable to have a simple means to protect these MMIC devices from extremes RF energy which is not inconsistent with the MMIC goals of low cost, small size, high level of integration and high reliability.

SUMMARY OF THE INVENTION

It is therefore a primary object of the invention to provide a terminal protection device that protects Monolithic Microwave Integrated Circuits from high voltages caused by extreme RF energy.

It is further object of the invention to provide a terminal protection device for a Monolithic Microwave Integrated Circuit that does not require additional processing steps to form the protection device.

It is an additional object of the invention to provide a Monolithic Microwave Integrated Circuit with a terminal protection device that triggers itself extremely fast.

It is still a further object of the invention to provide a Monolithic Microwave Integrated Circuit with a terminal protection device that is integral therewith for preventing permanent impairment to the semiconductor substrate or any of the Monolithic Microwave Integrated Circuit components deposited thereon.

It is still a further object of the invention to provide a Monolithic Microwave Integrated circuit with a terminal protection device that is capable of protecting the MMIC whenever an over voltage is present while allowing the MMIC to function normally between over voltage events.

The foregoing and other objects and advantages are attained in accordance with the invention through the use of a terminal protection device that includes a pair of electrodes in contact with the semiconductor substrate of the MMIC. One electrode provides an input to the device while the other is connected to ground. The electrodes each have a plurality of protrusions of teeth formed thereon and spaced equally from one another forming spark-gaps there between. The protrusions may also be cantilevered over the substrate to add further protection to the substrate. The MMIC and electrodes are enclosed within a sealed housing filled with an ionizable gas. In the preferred embodiment a photon emitting junction formed within the substrate and biased by the electrodes is designed to emit photons at a quantity and level of energy that facilitates the ionizing of the gas which triggers a discharge between the electrodes to occur quickly and at a voltage that is lower than the semiconductor substrate breakdown voltage. The discharge occurs across the electrode's spark-gaps when a certain potential difference between the electrodes is reached due to extreme RF energy present on the input transmission line. Consequently, once this short circuit is achieved, any additional RF over voltage energy is reflected due to the impedance mismatch in the input transmission line. A solid state limiter in the MMIC may be placed after the TPD to remove any spike leakage from the gas discharge TPD. A passivation layer is disposed on the substrate between the electrodes so that the voltage discharge across the spark-gaps does not affect the semiconductor substrate.

BRIEF DESCRIPTION OF THE DRAWINGS

The foregoing and other objects, aspects, uses and -advantages of the present invention will be more fully appreciated as the same becomes better understood when considered in connection with the following detailed description of the present invention and in conjunction with the accompanying drawings, in which.

DESCRIPTION OF THE PREFERRED EMBODIMENTS

Figure 1:
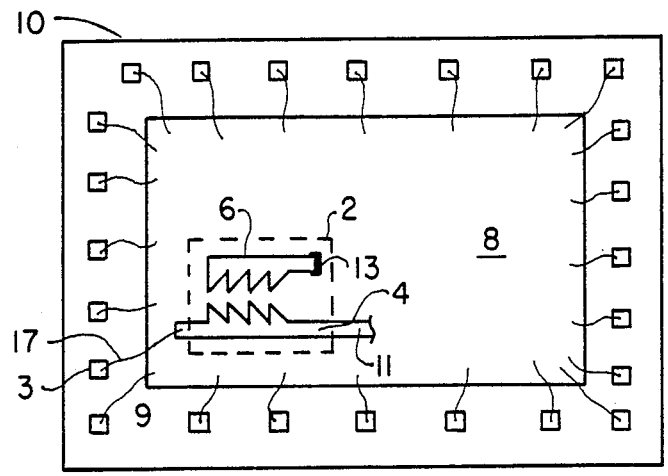
FIG. 1 shows a top view of a Monolithic Microwave Integrated Circuit chip package according to an aspect of the invention.

Referring now to the drawings, like reference numerals represent identical or corresponding parts throughout the several views.

FIG. 1 shows a top view of a typical MMIC chip package 10 having a terminal protection device 2 comprising a first electrode 4 and a second electrode 6 disposed in contact with the surface area of a semiconductor substrate 8 located over a photon emitting region or junction fabricated within the substrate 8. While GaAs is a preferred material for the substrate 8, other materials such as bulk silicon, silicon-on-sapphire or InP may be used. Electrode 4 is connected at one end 9 through a bond wire 17 to an input terminal 3 while its other end 11 is connected to other components and interconnections deposited on the substrate 8. Electrode 6 has end 13 connected to ground. Ground is meant in the sense that this electrode 6 is used to remove those electrons which are generated by fields incident on the MMIC which are in excess of the MMICs normal operating fields. Ground is also the electrical potential of the MMIC where there exists a potential of zero volts.

Figure 2:
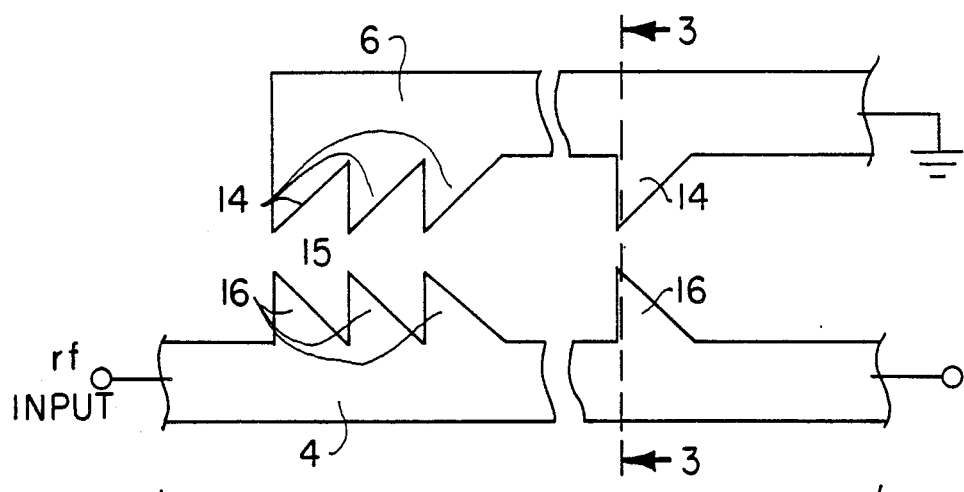
FIG. 2 shows a top view of electrodes in a terminal protection device on a MMIC semiconductor substrate according to an aspect of the invention.

FIG. 2 shows a detailed top view of electrodes 4 and 6 which are usually made of the metal gold, however other suitable material may be employed. Electrode 4 is shown with a plurality of protrusions or teeth 16 and electrode 6 is shown with a plurality of protrusions 14 equally spaced from one another forming aplurality of spark-gaps 15 between the electrodes 4 and 6. The protrusions 16 and 14, on electrodes 4 and 6 respectively, are pointed because the electric field concentration is higher on a pointed surface than on a round or flat surface. The increased field concentration contributes to a lesser avalanche initiation voltage across the terminals 4 and 6.

The spark gaps 15 are spaced so that their spacing matches the knee of the Paschen curve, giving the lowest possible arcing voltage. The knee of the Paschen curve is also dictated by the composition and pressure of the gas in the spark-gap 15 region, therefore the gas type and pressure is also adjusted for lowest arcing voltage and fastest avalanche formation time. Once a discharge across the spark-gaps 15 occurs a short circuit is achieved causing any additional over voltage energy on input terminal 3 to be reflected due to the impedance mismatch in the bond wire 17 leading to electrode 4. MMIC components down stream are therefore protected from this overvoltage.

Figure 3:
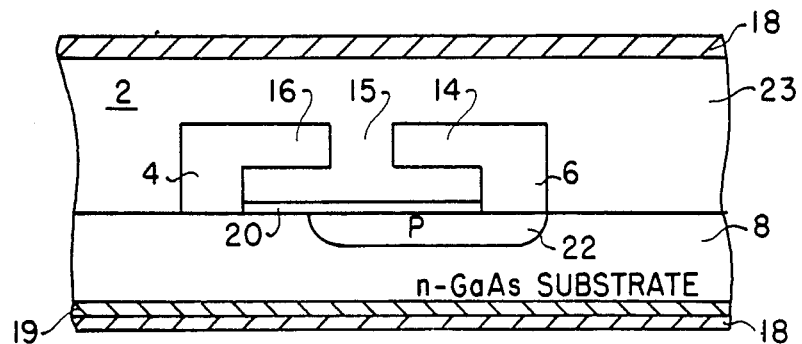
FIG. 3 shows a sectional view of a MMIC terminal protection device taken substantially as indicated along line A—A of FIG. 2.

FIG. 3 shows a sectional view of a MMIC terminal protection device 2 showing electrodes 4 and 6, with teeth 16 and 14 respectfully, on substrate 8 and ground plane 19 all enclosed within a sealed housing 18. As can be more clearly seen in FIG. 3 teeth 16 and 14 can be cantilevered on their respective electrodes so they extend over the surface area of substrate 8. This feature further helps to ensure that the voltage discharge occurs across the spark-gaps 15 within the ionizable gas and not in the GaAs substrate 8.

An ionizable gas, such as Xenon, Argon, or Krypton, fills the void 23 within the housing 18. The gas is chosen such that photoionization can be made to efficiently and rapidly occur once free charges are present in the gas. Facilitating the photoionization of the gas will help cause a voltage discharge across the spark-gaps to occur more quickly than would occur without photoionization. Consequently, the semiconductor substrate and circuit components deposited thereon are protected in the MMIC.

A photon or light emitting junction is the preferred source for generating the free charge. For an LED, a pn junction is used to convert electrical bias to light (i.e., photons). The photons free electrons from the molecules of the gas in the environment of the spark gaps 15. In FIG. 3 the p region 22 within the n region GaAs substrate 8 form the light emitting junction. This junction is designed such that when a potential difference between the electrodes 4 and 6 reach a predetermined value the junction becomes electrically biased. In other words, the junction becomes biased as a result of extreme RF input signals on input terminal 3. This potential difference from the extreme RF signal biases the junction and provides the electrical current to generate the photonic activity. The p region 22 is doped to emit photons at a wavelength that facilitates the ionizing of the gas. The junction emits photons in such quantities and energies in the gas that it triggers a discharge between the electrodes to occur quickly (on the order of 1 nanosecond) and at at a voltage that is lower than the semiconductor substrate breakdown voltage.

A passivation layer 20 may be deposited on the semiconductor substrate 8 between electrodes 4 and 6. The passivation layer 20 permits photons from the photon emitting junction to seed the gas but blocks photons, generated by the voltage discharge across the spark-gaps 15, from inducing conduction in the semiconductor substrate 8.

Obviously, numerous modifications and variations of the present invention are possible in light of the above teachings. It is therefore to be understood that within the scope of the appended claims, the invention may be practiced otherwise than as specifically described herein.

What is claimed is:

1. A terminal protection device for protecting a monolithic microwave integrated circuit from high energy incident RF power comprising:
   a sealed housing;
   an ionizable gas enclosed within said housing;
   a semiconductor substrate having a surface area enclosed within said housing;
   a photon generating region extending within said semiconductor substrate along said surface area that facilitates the ionizing of said gas; and
   first and second electrodes disposed in contact with said surface area each having a plurality of protrusions thereon equally spaced from one another forming spark-gaps therebetween, said first and second electrodes disposed on opposite sides of said photon generating region so that as apotential difference between said first and second electrodes increases towards a predetermined value said photon generating region is biased by the incident RF power to emit photons which ionize said gas resulting in a voltage discharge across said spark-gaps to occur at a lower voltage than the semiconductor substrate breakdown voltage.

2. The terminal protection device of claim 1 wherein said plurality of protrusions on said first and second electrodes are cantilevered to extend over said surface area for ensuring that the voltage discharge occurs across said spark-gaps and not within said semiconductor substrate.

3. The terminal protection device of claim 1 wherein said photon generating region comprises a light emitting junction formed within said substrate that emits photons at a wavelength that facilitates the ionizing of said gas.

4. The terminal protection device of claim 1 wherein said semiconductor substrate comprises GaAs.

5. The terminal protection device of claim 1 wherein said terminal protection device further comprises a passivation layer deposited on said surface area between said first and second electrodes, said passivation layer permitting photons from said photon generating region to seed said ionizable gas but blocking photons generated by the voltage discharge across said spark-gaps so that said voltage discharge does not induce conduction in said semiconductor substrate.

6. A terminal protection device for protecting a monolithic microwave integrated circuit from high energy input power comprising:
   a sealed housing;
   an ionizable gas enclosed within said housing;
   a GaAs semiconductor substrate having a surface area enclosed within said housing;
   a light emitting junction region extending within said semiconductor substrate along said surface area that emits photons at a wavelength that facilitates the ionizing of said gas; and
   first and second electrodes disposed in contact with said surface area each having a plurality of cantilevered protrusions extending over said surface area and equally spaced from one another forming spark-gaps therebetween, said first and second electrodes disposed on opposite sides of said light emitting junction so that as a potential difference between said first and second electrodes increases towards a predetermined value said light emitting junction emits photons which ionize said gas, causing a voltage discharge across said spark-gaps to occur at a lower voltage than the semiconductor substrate breakdown voltage.

* * * * *